US00RE45842E

(19) United States
(12) Reissued Patent
Redline et al.

(10) Patent Number: US RE45,842 E
(45) Date of Reissued Patent: Jan. 12, 2016

(54) METHOD FOR ENHANCING THE SOLDERABILITY OF A SURFACE

(76) Inventors: Ronald Redline, Prospect, CT (US); David Sawoska, Watertown, CT (US); Peter Kukanskis, Woodbury, CT (US); Donald Ferrier, Thomaston, CT (US); Eric Yakobson, Aliso Viego, CA (US)

(21) Appl. No.: 13/463,087

(22) Filed: May 3, 2012

Related U.S. Patent Documents

Reissue of:
(64) Patent No.: 6,544,397
Issued: Apr. 8, 2003
Appl. No.: 09/821,205
Filed: Mar. 29, 2001

U.S. Applications:
(60) Continuation-in-part of application No. 09/698,370, filed on Oct. 26, 2000, now Pat. No. 6,444,109, which is a division of application No. 09/251,641, filed on Feb. 17, 1999, now Pat. No. 6,200,451.

(51) Int. Cl.

| | |
|---|---|
| ***B23K 35/00*** | (2006.01) |
| ***C23C 18/42*** | (2006.01) |
| ***C25D 3/46*** | (2006.01) |
| ***H05K 3/24*** | (2006.01) |
| ***C23C 18/31*** | (2006.01) |
| ***C25D 3/02*** | (2006.01) |
| ***C23C 18/54*** | (2006.01) |

(52) U.S. Cl.
CPC ..... *H05K 3/244* (2013.01); *B23K 35/007* (2013.01); *C23C 18/54* (2013.01)

(58) Field of Classification Search
CPC ..... H05K 3/244; H05K 3/241; H05K 3/242; H05K 3/282; H05K 3/34; H01L 2924/00; H01L 2924/01047
USPC ..... 205/85, 196, 220; 106/1.23; 427/97.1, 427/99.5, 125, 343, 436
See application file for complete search history.

(56) References Cited

U.S. PATENT DOCUMENTS

| | | | | |
|---|---|---|---|---|
| 2,757,104 | A | | 7/1956 | Bruce |
| 2,883,288 | A | | 4/1959 | Dobbs et al. |
| 3,130,072 | A | | 4/1964 | Gardner et al. |
| 3,162,512 | A | | 12/1964 | Robinson |
| 3,202,488 | A | | 8/1965 | Ehrreich et al. |
| 3,230,098 | A | | 1/1966 | Robinson |
| 3,294,578 | A | | 12/1966 | Popeck |
| 3,330,672 | A | | 7/1967 | Bennett et al. |
| 3,460,953 | A | | 8/1969 | Schwartz |
| 3,468,804 | A | | 9/1969 | Perry |
| 3,531,315 | A | | 9/1970 | Golben |
| 3,729,394 | A | * | 4/1973 | Hsu et al. ..... 205/312 |
| 3,978,271 | A | | 8/1976 | Greenberg |
| 3,993,845 | A | | 11/1976 | Greenberg et al. |
| 4,013,523 | A | * | 3/1977 | Stevens et al. ..... 205/247 |
| 4,067,784 | A | * | 1/1978 | Leahy et al. ..... 205/263 |
| 4,079,078 | A | * | 3/1978 | Collins ..... 510/339 |
| 4,091,172 | A | | 5/1978 | Miller |
| 4,151,099 | A | * | 4/1979 | Nassry et al. ..... 508/250 |
| 4,187,198 | A | | 2/1980 | Zeblisky |
| 4,189,510 | A | | 2/1980 | McIntyre et al. |
| 4,255,214 | A | | 3/1981 | Workens |
| 4,265,715 | A | | 5/1981 | Rosegren et al. |
| 4,304,846 | A | | 12/1981 | Marthaler et al. |
| 4,368,223 | A | | 1/1983 | Kobayashi et al. |
| 4,389,431 | A | | 6/1983 | Erismann |
| 4,440,805 | A | | 4/1984 | Feldstein |
| 4,568,476 | A | * | 2/1986 | Kielman et al. ..... 510/226 |
| 4,568,570 | A | | 2/1986 | Giesecke |
| 4,666,735 | A | | 5/1987 | Hoover et al. |
| 4,753,821 | A | | 6/1988 | Giesecke et al. |
| 4,755,265 | A | | 7/1988 | Young et al. |
| 4,777,078 | A | | 10/1988 | Miyabayashi et al. |
| 4,781,980 | A | | 11/1988 | Yoshitake et al. |
| 4,800,132 | A | | 1/1989 | Grunwald et al. |
| 4,821,148 | A | | 4/1989 | Kobayashi et al. |
| 4,846,918 | A | | 7/1989 | Nelson et al. |
| 4,873,139 | A | | 10/1989 | Kinosky |
| 4,908,241 | A | | 3/1990 | Quast et al. |
| 4,940,181 | A | | 7/1990 | Juskey, Jr. et al. |

(Continued)

FOREIGN PATENT DOCUMENTS

| | | | |
|---|---|---|---|
| AU | 5019272 | A | 6/1974 |
| DE | 4316679 | C1 | 7/1994 |

(Continued)

OTHER PUBLICATIONS

F. A. Lowenheim, Modern Electroplating, John Wiley & Sons, Inc., New York, 1974, pp. 36-38, 358-365.*

(Continued)

*Primary Examiner* — Carlos Lopez
(74) *Attorney, Agent, or Firm* — Carmody Torrance Sandak & Hennessey LLP

(57) ABSTRACT

A method for enhancing the solderability of a metallic surface is disclosed where the metallic surface is plated with an immersion silver plate prior to soldering, which immersion silver plate is treated with an additive selected from the group consisting of fatty amines, fatty amides, quaternary salts, amphateric salts, resinous amines, resinous amides, fatty acids, resinous acids, ethoxylated derivatives of any of the foregoing, and mixtures of any of the foregoing. The immersion silver deposits created are resistant to electromigration.

11 Claims, No Drawings

(56) References Cited

U.S. PATENT DOCUMENTS

| | | | | |
|---|---|---|---|---|
| 4,978,423 | A | 12/1990 | Durnwirth, Jr. et al. | |
| 5,037,482 | A | 8/1991 | Kukanskis et al. | |
| 5,061,566 | A | 10/1991 | Morgan et al. | |
| 5,094,726 | A * | 3/1992 | Nobel et al. | 205/254 |
| 5,115,051 | A | 5/1992 | Shimizu et al. | |
| 5,160,579 | A | 11/1992 | Larson | |
| 5,173,130 | A | 12/1992 | Kinoshita et al. | |
| 5,178,909 | A | 1/1993 | Hayashi | |
| 5,186,984 | A | 2/1993 | Gabbert | |
| 5,196,053 | A | 3/1993 | Dodd et al. | |
| 5,235,139 | A | 8/1993 | Bengston et al. | |
| 5,256,275 | A | 10/1993 | Brasch | |
| 5,322,553 | A | 6/1994 | Mandich et al. | |
| 5,348,590 | A | 9/1994 | Shigemura et al. | |
| 5,393,861 | A | 2/1995 | Sakae et al. | |
| 5,411,595 | A * | 5/1995 | Bokisa et al. | 134/2 |
| 5,468,515 | A | 11/1995 | Ferrier et al. | |
| 5,518,760 | A | 5/1996 | Ferrier et al. | |
| 5,567,357 | A | 10/1996 | Wakita | |
| 5,576,053 | A | 11/1996 | Senda et al. | |
| 5,725,640 | A | 3/1998 | Joshi et al. | |
| 5,733,598 | A | 3/1998 | Sera et al. | |
| 5,733,599 | A | 3/1998 | Ferrier et al. | |
| 5,824,631 | A | 10/1998 | Wagenknecht et al. | |
| 5,876,517 | A | 3/1999 | Jeannier et al. | |
| 5,935,640 | A | 8/1999 | Ferrier et al. | |
| 5,955,141 | A | 9/1999 | Soutar et al. | |
| 6,025,077 | A * | 2/2000 | Yamaki et al. | 428/447 |
| 6,136,460 | A * | 10/2000 | Chen et al. | 428/699 |
| 6,183,545 | B1 * | 2/2001 | Okuhama et al. | 205/263 |
| 6,200,451 | B1 * | 3/2001 | Redline et al. | 205/85 |
| 6,203,986 | B1 * | 3/2001 | Singer et al. | 435/6.11 |
| 6,235,348 | B1 | 5/2001 | Shimizu et al. | |
| 6,319,543 | B1 | 11/2001 | Soutar et al. | |
| 6,331,201 | B1 | 12/2001 | McGrath et al. | |
| 6,375,822 | B1 * | 4/2002 | Taytsas | 205/220 |
| 6,395,329 | B2 | 5/2002 | Soutar et al. | |
| 6,444,109 | B1 | 9/2002 | Redline et al. | |
| 6,544,397 | B2 | 4/2003 | Redline et al. | |
| 6,860,925 | B2 | 3/2005 | Soutar | |
| 6,905,587 | B2 | 6/2005 | Redline et al. | |
| 2002/0150692 | A1 | 10/2002 | Soutar et al. | |

FOREIGN PATENT DOCUMENTS

| | | | |
|---|---|---|---|
| EP | 0797380 | A1 | 9/1997 |
| GB | 592443 | A | 9/1947 |
| GB | 602591 | A | 5/1948 |
| GB | 1120583 | A | 7/1968 |
| GB | 2201163 | A | 8/1988 |
| JP | 51-27819 | | 3/1976 |
| JP | 53-134759 | | 11/1978 |
| JP | S60-100679 | | 6/1985 |
| JP | 03-002379 | | 1/1991 |
| JP | 04-110474 | | 4/1992 |
| JP | 05-263258 | | 10/1993 |
| JP | 08-255968 | | 10/1996 |
| RU | 2753992/22-02 | | 5/1981 |
| WO | WO 94/26954 | | 11/1994 |
| WO | WO 96/17974 | | 6/1996 |
| WO | WO 96/17975 | | 6/1996 |

OTHER PUBLICATIONS

Arthur Rose et al, The Condensed Chemical Dictionary, Reinhold Book Corporation, New York, 1966, pp. 409, 691, 704, 891.*

Li et al., Tarnish Protection for Silver Electrodeposits, Plating and Surface Finishing, pp. 58-61, Feb. 1988.

Russev et al., Immersion Silvering of Copper, Metal Finishing, pp. 27-30, Jan. 1983.

Singh et al., Silver tarnishing and its prevention—A review, Anti-Corrosion, pp. 4-8, Jul. 1983.

Philpott, An Economic Process for the Deposition of Thin Tarnish Resistant Coatings, Platinum Metals Rev., vol. 6, pp. 144-146, 1962.

* cited by examiner

METHOD FOR ENHANCING THE SOLDERABILITY OF A SURFACE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

This application is a continuation-in-part of U.S. patent application No. 09/698,370, filed Oct. 26, 2000, now U.S. Pat. No. 6,444,109, which is a divisional of U.S. patent application Ser. No. 09/251,641, filed Feb. 17, 1999, now U.S. Pat. No. 6,200,451.

FIELD OF THE INVENTION

This invention relates generally to a method of treating a surface which treatment enhances the severability of the surface. The method is particularly useful in the fabrication and assembly of printed circuit boards.

BACKGROUND OF THE INVENTION

Soldering is generally used for making mechanical, electromechanical, or electronic connections to a variety of articles. The distinction between expected functions of the joints is important because each application has its own specific requirements for surface preparation. Of the three soldering applications, making electronic connections is the most demanding.

In the manufacture of electronic equipment utilizing printed circuits, connections of electronic components to the printed circuits are made by soldering of the leads of the components to the through-holes, surrounding pads, lands and other points of connection (collectively, "Areas of Connection"). Typically the connection occurs by wave soldering techniques.

To facilitate this soldering operation, the printed circuit fabricator is required to arrange that the through-holes, pads, lands and other points of connection are receptive to the subsequent soldering processes. Thus these surfaces must be readily wettable by the solder and permit an integral conductive connection with the leads or surfaces of the electronic components. Because of these needs, printed circuit fabricators have devised various methods of preserving and enhancing the solderability of surfaces.

One means of arranging good solderability of the surfaces in question is to provide the surfaces with a pre-coating of solder. This is typically performed by a process called hot air solder leveling or through some type of plating process. In printed circuit fabrication, however, this method has several drawbacks. The use of hot air solder leveling may cause unacceptably high rate of defects due to shorts, particularly when dealing with small circuits. If plating is used, since it is not easy to selectively provide these areas with solder, all conductive areas of the board must be solder plated causing severe problems with the subsequent application of solder mask. In addition the foregoing processes are inefficient and relatively expensive.

Another means of arranging good solderability of these surfaces is to plate them with a final finish coating of a precious metal such as gold, palladium or rhodium. U.S. Pat. No. 5,235,139 (Bengston, et. al.), the teachings of which are incorporated herein by reference, proposes a method for achieving this previous metal final finish. Bengston et. al. propose plating the copper areas to be soldered with electroless nickel-boron, followed by a precious metal coating such as gold. See also U.S. Pat. No. 4,940,181 to Juskey, Jr. et al., the teachings of which are incorporated herein by reference for a similar process which teaches the plating of electroless copper, followed by electrolytic copper, followed by nickel followed by gold as a solderable surface. These processes work well but are time consuming and expensive.

Various attempts have been made to selectively apply solder to the necessary areas only. One such method involves use of organic etch resists over the solder plated areas of connection followed by selective stripping of tin-lead from the copper traces before application of the solder mask. See U.S. Pat. No. 4,978,423 to Durnwith et. al. See also U.S. Pat. No. 5,160,579 to Larson, the teachings of which are incorporated herein by reference, for other known selective solder processes.

Soldering directly to copper surfaces has been difficult and inconsistent. These problems are due mainly to the inability of keeping the copper surfaces clean and free of oxidation throughout the soldering operation. Various organic treatments have been developed to preserve copper surfaces in a readily solderable state. For example, see U.S. Pat. No. 5,173,130 (Kinoshita) which teaches the use of certain 2-alkylbenzimidazoles as copper pre-fluxes to preserve the solderability of the copper surfaces. Treatments such as those taught in Kinoshita have proven successful but there is still need to improve the reliability of the process.

The method of preserving solderability proposed herein is the coating of copper surfaces to be soldered with an immersion silver plate prior to soldering. It has been found, however, that when the foregoing method is used the immersion silver coating has a tendency to develop outgrowths or filaments via an electromigration mechanism when the circuits are being used (i.e. with voltage potentials present) in the presence of moisture.

The tendency for electromigration to occur can be measured by a standard technique specified in Bellcore GR-78-CORE (13.2.5, 13.2.7) standard test procedures which are incorporated herein by reference in their entirety. The foregoing Bellcore procedure measures the average insulation resistance between circuit features. Bellcore and IPC standards require, that the average insulation resistance not decrease by more than one decade between the initial value (obtained after a conditioning period of 96 hours at 85° C./85% relative humidity with no bias) and the final value (obtained after an additional 500 hours at 85° C./85% relative humidity with a 10 V.dc bias applied).

One method which may be used to overcome the electromigration of immersion silver plating is to coat the immersion silver plate with another more noble metal such as gold. The disadvantages of this method are the expense of gold plating as well as the necessity for additional process steps.

It is an object of this invention to propose a method for preserving and enhancing the solderability of copper surfaces by plating said copper surface with a novel immersion silver plate which is more resistant to electromigration than prior art immersion silver deposits.

SUMMARY OF THE INVENTION

The current invention proposes the use of an immersion silver coating is in improved solderability preservative for various surfaces, particularly copper surfaces. Preferred compositions for depositing the immersion silver coating are also disclosed. The novel immersion silver plating process produces a silver plate which is more resistant to electromigration than conventional immersion silver deposits. The process proposed is a versatile, low cost method for effectively preserving the solderability of surfaces, particularly copper surfaces and areas of connection on printed circuit boards.

DETAILED DESCRIPTION OF THE INVENTION

The current invention proposes a process for preserving and enhancing the solderability of a metal surface, particularly copper surfaces. The proposed process comprises the following steps:

a). cleaning the metal surface;

b). optionally, etching the metal surface;

c). treating the metal surface with an immersion silver plating solution, said solution comprising:

1. a soluble source of silver ions;
2. an acid;
3. an additive selected from the group consisting of fatty amines, fatty amides, quaternary salts, amphoteric salts, resinous amines, resinous amides, fatty acids, resinous acids, and mixtures of the foregoing;
4. optionally, an imidazole, benzimidazole, or imidazole derivative; and
5. optionally, an oxidant.

Alternatively, the proposed process comprises the following steps:

a). cleaning the metal surfaces;

b). optionally, etching the metal surfaces;

c). treating the metal surface with an immersion silver plating solution;

d). treating the immersion silver plated surface with a solution which comprises an additive selected from the group consisting of fatty amines, fatty amides, quaternary salts, amphoteric salts, resinous amines, resinous amides, fatly acids, resinous acids and mixtures of the foregoing.

It has been discovered that immersion silver deposits provide excellent solderability preservatives, which are particularly useful in the fabrication of printed circuit boards. The solderability achievable with a simple immersion silver deposit in printed circuit applications has unexpectedly been found to exceed that achievable with prior art nickel-gold plating processes such as described in U.S. Pat. No. 5,235,139 and unexpectedly exceeds that achievable with other immersion deposits. As can be seen in the examples to follow, the processes of the current invention yield surfaces which are very solderable under adverse conditions. In printed circuit applications the surfaces are wire bondable. In addition the incorporation of an additive, selected from the group consisting of fatty amines, fatty amides, quaternary salts, amphoteric salts, resinous amines, resinous amides, fatty acids, resinous acids and mixtures of the foregoing, into the immersion silver deposit by incorporation in the plating bath or subsequent treatment of the plated surface greatly reduces the tendency of the silver deposit to electromigrate. Immersion plating is a process which results from a replacement reaction whereby the surface being plated dissolves into solution and at the same time the metal being plated deposits from the plating solution onto the surface. The immersion plating initiates without prior activation of the surfaces. The metal to be plated is generally more noble than the surface metal. Thus immersion plating is usually significantly easier to control and significantly more cost effective than electroless plating, which requires sophisticated auto catalytic plating solutions and processes for activation of the surfaces prior to plating.

The soluble source of silver ions can be derived from a variety of silver compounds. The inventors have found silver nitrate to be most preferable. The concentration of silver in the plating solution can range from 0.1 to 25 grams per liter, but is most preferably present in a concentration of 0.5 to 2 grams per liter.

Although a variety of acids are suitable for use in this formulation, the inventors have found that methane sulfonic acid or nitric acid is most preferred. The concentration of acid in the plating solution can range from 1 to 150 grams per liter but is preferably in the range of 5 to 50 grams per liter.

In order to prevent or significantly reduce the tendency for immersion silver plates to electromigrate in the application proposed, the inventors have found it necessary to incorporate certain additives into the plated deposit, either by incorporation of the additives in the plating bath itself or by subsequent treatment of the plated surface with the additives. Incorporation of the additives into the plating bath itself is the preferred method. The additives may be selected from the group consisting of fatty amines, fatty acids, fatty amides, quaternary salts, amphoteric salts, resinous amines, resinous amides, resinous acids and mixtures of the foregoing. Examples of suitable fatty amines are tallowamine and cocoamine. Examples of suitable fatty acids are stearic acid, oleic acid, palmitic acid and acids derived from the distillation of tall oil. Examples of suitable fatty amides are cocamide and tallowamide. Examples of suitable quaternary salts are (stearamidopropyl) dimethyl hydroxyethylammonium dihydrogen phosphate. Examples of suitable amphoteric salts are alkyliminodipropionic acid monosodium salts wherein the alkyl portion may be coco, tallow or similar organic alkyl chains. Examples of suitable resinous amines are amines derived from tall oil acids. Examples of suitable resinous amides are cocoamide, tallow amide and amides derived from tall oil acids. Examples of suitable resinous acids are acids derived from the distillation of tall oil such as abetic acid. Also suitable are ethoxylated and/or propoxylated versions of any of the foregoing materials such as ethoxylated or propoxylated fatty amines, ethoxylated or propoxylated fatty acids, ethoxylated or propoxylated quaternary salts, ethoxylated or propoxylated amphoteric salts, ethoxylated or propoxylated resinous amines, ethoxylated or propoxylated resinous amides, and ethoxylated or propoxylated resinous acids. Preferred additives include ethoxylated tallowamine, cyastat LS (quaternary ammonium methyl sulfate of a fatty amidoalkyl amine) and ethoxylated cocoamine. The concentration of the foregoing additives in the immersion silver plating bath or in the subsequent surface treatment composition may range from 0.1 to 15 grams per liter but is preferably from 1 to 5 grams per liter.

The inventors have discovered that the inclusion of imidazole or imidazole derivative of the following formula has a significant positive impact upon the plate produced by immersion plating solutions, particularly immersion silver plating solutions used in the processes of this invention:

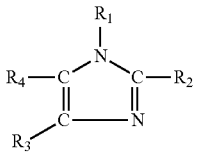

Wherein $R_1$, $R_2$, $R_3$ and $R_4$ are independently selected from the group consisting of substituted or unsubstituted alkyl groups, substituted or unsubstituted aryl groups, halogens, nitro groups and hydrogen.

The inclusion of an imidazole as described above brightens the plated deposit and improves the integrity and physical properties of the resultant plated deposit. In addition, the imidazole also extends the useful life of the immersion plating solution. The inventors have found that histidine is a particularly preferred imidazole for the purposes of these processes.

The inclusion of imidazoles provides significant advantages in immersion plating solutions in general, but is particularly useful and advantageous in immersion silver plating. The inventors have found that immersion silver deposits resulting from plating baths containing imidazoles are brighter, smoother and more cohesive than immersion silver deposits plated from baths which do not have imidazoles. In addition the immersion plating baths with imidazoles have longer effective lives than comparable baths without imidazoles. These same advantages are achievable by the inclusion of imidazoles in other immersion plating baths, including copper, palladium, gold, ruthenium and rhodium.

With respect to the immersion silver compositions useful in the present invention, the plating solution may, optionally, advantageously also contain an oxidant. The inventors have found that nitro aromatic compounds most preferably dinitro compounds, such as 3,5 dinitrohydroxybenzoic acid are preferred in this regard. The concentration of such an oxidant in the solution can range from 0.1 to 25 grams per liter, but is preferably from 0.5 to 2 grams per liter.

The immersion silver solution can be used in the processes of the current invention at temperatures ranging, from room temperature to 200° F. but is preferably used at from 80 to 120° F. The time for immersion in the plating solution can range from 1 to 30 minutes but is preferably from 1 to 5 minutes.

The immersion silver solution of the current invention is thus used to plate a thin layer of silver onto the surface to be soldered. It is believed that the resultant silver coating should be from 1 to 100 micro inches thick, preferably from 10 to 60 micro inches thick for effective enhancement and preservation of the solderability of the surface. Although this process is effective in soldering many surfaces, it is particularly useful in soldering copper surfaces, such as Areas of Connection on printed circuit boards.

Although this technique may be utilized advantageously over almost any surface, it is most useful in the fabrication of printed circuit boards, particularly solder mask over bare copper (SMOBC) boards. Thus, in fabricating SMOBC boards, the solder mask is applied to the surfaces of the board then exposed and developed to reveal the Areas of Connection. These Areas of Connection are then essentially the only exposed areas of copper on the board, with the remainder essentially being covered by solder mask. These exposed Areas of Connection are thus destined to be points of attachment, in most cases by soldering, when the electronic components are later placed on the board later in the fabrication cycle. Therefore, the solderability of these exposed points, generally copper, must be enhanced and preserved.

Thus according to the current invention these areas are then preferably cleaned, using an acid cleaner, and subsequently microetched to prepare the surface for acceptable immersion plating. Following this preferred preparation, the board is immersed in the immersion silver plating solution, such that a silver deposit of appropriate thickness is achieved.

The invention is further described for illustrative purposes only in the following examples which are in no way limiting of the invention itself. In each of the examples standard IPC-B-25 test circuit boards are utilized in order to provide consistency. IPC-B-25 standard is incorporated herein by reference in its entirety.

EXAMPLE I

IPC-B-25 test circuit boards were processed with the following steps:

a). Acid Cleaner, 5 minutes, 120° F.
b). Water Rinse
c). Sodium persulfate/sulfuric acid microetch, 1 minute, 95° F.
d). Water rinse
e). Water rinse
f). Immersion silver plate using the following composition

| | |
|---|---|
| hydroxy ethylenediamine tetracetic acid | 10 gr/l |
| silver nitrate | 24 gr/l |
| igepal Co730 | 5.0 gr/l |
| imidazole | 10 gr/l |
| nitric acid | 320 ml/l |

g). water rinse.

The circuit boards were then tested according to the Bellcore GR-78-Core (13.2.5, 13.2.7) standard test method and the results are recorded in Table 1.

EXAMPLE II

IPC-B-25 test circuit boards were treated as noted in Example 1 except that in this case the immersion silver plating bath also contained 5.0 gr/l of tallow amine ethoxylated with 15 moles of ethylene oxide. The circuit boards were then tested according to the Belcore GR-78-Core (13.2.5, 13.2.7) standard test method and the results are recorded in Table 1.

EXAMPLE III

IPC-B-25 test circuit boards were treated as noted in Example 1 except that in this case the immersion silver plating bath also contained 1.1 g/l of Pamak 25-S which is available from Hercules, Incorporated of Wilmington, Del. and is a blend of fatty and resinous acids. The circuit boards were then tested according to Belcore GR-78-Core (13.2.5, 13.2.7) standard test method and the results are recorded in Table 1.

EXAMPLE IV

IPC-B-25 test circuit boards were treated as noted in Example 1 except in this case after step (g) the circuit boards were further processed as follows:

h). treatment with an aqueous solution containing:
5.0 gr./l Cyastat L5 (quaternary ammonium methylsulfate of a fatty amidoalkyl amine)
32 ml/l Nitric Acid (70%)
balance—water.
i). water rinse.

The circuit boards were then tested according to Belcore GR-78-Core (13.2.5, 13.2.7) standard test method and the results are recorded in Table 1.

EXAMPLE V

IPC-B-25 test circuit boards were treated as noted in Example IV except that in ibis case the Cyastat LS was replaced with 5.0 gr/l Cocoamine ethoxylated with 2 moles of ethylene oxide. The circuit boards were then tested according to Belcore GR-78-Core (13.2.5, 13.2.7) standard test method and the results are recorded in Table 1.

TABLE 1

| Example | Initial Value (ohms) | Final Value (ohms) |
|---|---|---|
| 1 | 2.0E + 09 | <1.0E + 06 |
| 2 | 2.6E + 09 | 3.3E + 09 |
| 3 | 4.1E + 09 | 7.9E + 09 |
| 4 | 3.0H + 09 | 6.8E + 08 |
| 5 | 3.9E + 09 | 4.5E + 09 |

We claim:

[1. A process for improving the solderability of a metal surface, said process comprising treating the metal surface with an immersion silver plating solution, said solution comprising a). a soluble source of silver ions;

b). an acid;

c). from about 0.1 g/l to about 15 g/l of an additive selected from the group consisting of fatty amines, fatty amides, quaternary salts, amphoteric salts, resinous amines, resinous amides, fatty acids, resinous acids, ethoxylated versions of any of the foregoing, propoxylated versions of any of the foregoing and mixtures of any of the foregoing.]

[2. A process according to claim 1 wherein the silver plating solution also comprises material selected from the group consisting of imidazoles, benzimidazoles, imidazole derivatives and benzimidazole derivatives.]

[3. A process according to claim 1 wherein the silver plating solution also comprises an oxidant.]

[4. A process according to claim 1 wherein the metal surface comprises copper.]

[5. A process according to claim 1 wherein the additive is selected from the group consisting of ethoxylated tallowamine, ethoxylated cocoamine, tallow amine, cocoamine, amines derived from tall oil acids, ethoxylated amines derived from tall oil acids, stearic acid, oleic acid, palmitic acid, acids derived from the distillation of tall oil, (stearamidopropyl) dimethyl hydroxyethylammonium dihydrogen phosphate, alkyliminodipropionic acid monosodium salts, and mixtures of the foregoing.]

[6. A process according to claim 4 wherein the silver plating solution also comprises a material selected from the group consisting of imidazoles, benzimidazoles, imidazole derivatives, and benzimidazole derivatives.]

[7. A process according to claim 6 wherein the silver plating solution also comprises an oxidant.]

[8. A process according to claim 7 wherein the additive is selected from the group consisting of ethoxylated tallowamine, ethoxylated cocoamine, tallow amine, cocoamine, amines derived from tall oil acids, ethoxylated amines derived from tall oil acids, stearic acid, oleic acid, palmitic acid, acids derived from the distillation of tall oil, (stearamidopropyl) dimethyl hydroxyethylaminium dihydrogen phosphate, alkyliminadipropionic acid monosodium salts, and mixtures of the foregoing.]

[9. An immersion silver plating solution comprising an additive selected from the group consisting of ethoxylared tallowamine, ethoxylated cocoamine, amines derived from tall oil acids, ethoxylated amines derived from tall oil acids, stearic acid, oleic acid, palmitic acid, acids derived from the distillation of tall oil, (stearamidopropyl)dimethyl hydroxyethylaminium dihydrogen phosphate, alkyliminadipropionic acid monosodium salts, and mixtures of the foregoing.]

[10. An immersion plating solution according to claim 9 also comprising a material selected from the group consisting of imidazoles, benzimidazoles, imidazole derivatives, and benzimidazole derivatives.]

[11. An immersion plating solution according to claim 9 also comprising an oxidant.]

*12. A process for improving the solderability of a metal surface, said process comprising treating the metal surface with an immersion silver plating solution, said solution comprising*

*a) a soluble source of silver ions;*

*b) an acid;*

*c) from about 0.1 g/l to about 15 g/l of an additive selected from the group consisting of resinous amines, resinous amides, fatty acids, resinous acids, ethoxylated versions of any of the foregoing, propoxylated versions of any of the foregoing and mixtures of any of the foregoing.*

*13. A process according to claim 12 wherein the silver plating solution also comprises material selected from the group consisting of imidazoles, benzimidazoles, imidazole derivatives and benzimidazole derivatives.*

*14. A process according to claim 12 wherein the silver plating solution also comprises an oxidant.*

*15. A process according to claim 12 wherein the metal surface comprises copper.*

*16. A process according to claim 12 wherein the additive is selected from the group consisting of amines derived from tall oil acids, ethoxylated amines derived from tall oil acids, stearic acid, oleic acid, palmitic acid, acids derived from the distillation of tall oil, alkyliminodipropionic acid monosodium salts, and mixtures of the foregoing.*

*17. A process according to claim 15 wherein the silver plating solution also comprises a material selected from the group consisting of imidazoles, benzimidazoles, imidazole derivatives, and benzimidazole derivatives.*

*18. A process according to claim 17 wherein the silver plating solution also comprises an oxidant.*

*19. A process according to claim 18 wherein the additive is selected from the group consisting of amines derived from tall oil acids, ethoxylated amines derived from tall oil acids, stearic acid, oleic acid, palmitic acid, acids derived from the distillation of tall oil, alkyliminodipropionic acid monosodium salts, and mixtures of the foregoing.*

*20. An immersion silver plating solution comprising a soluble source of silver ions, an acid, and from about 0.1 g/l to about 15 g/l of an additive selected from the group consisting of amines derived from tall oil acids, ethoxylated amines derived from tall oil acids, stearic acid, oleic acid, palmitic acid, acids derived from the distillation of tall oil, alkyliminodipropionic acid monosodium salts, and mixtures of the foregoing.*

*21. An immersion plating solution according to claim 20 also comprising a material selected from the group consisting of imidazoles, benzimidazoles, imidazole derivatives, and benzimidazole derivatives.*

*22. An immersion plating solution according to claim 20 also comprising an oxidant.*

* * * * *